(12) United States Patent
Koike et al.

(10) Patent No.: US 12,421,479 B2
(45) Date of Patent: Sep. 23, 2025

(54) CLEANING AGENT AND METHOD FOR MANUFACTURING SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Daisuke Koike, Tama Tokyo (JP); Yuning Tsai, Yokohama Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 617 days.

(21) Appl. No.: 17/679,935

(22) Filed: Feb. 24, 2022

(65) Prior Publication Data

US 2023/0095013 A1 Mar. 30, 2023

(30) Foreign Application Priority Data

Sep. 16, 2021 (JP) .................. 2021-151355

(51) Int. Cl.
| | |
|---|---|
| C11D 3/28 | (2006.01) |
| C11D 1/00 | (2006.01) |
| C11D 3/20 | (2006.01) |
| C11D 3/43 | (2006.01) |
| C11D 7/32 | (2006.01) |
| C11D 7/50 | (2006.01) |
| H01L 21/48 | (2006.01) |
| H01L 21/56 | (2006.01) |

(52) U.S. Cl.
CPC .............. *C11D 7/3281* (2013.01); *C11D 1/00* (2013.01); *C11D 3/43* (2013.01); *C11D 7/5013* (2013.01); *H01L 21/4825* (2013.01); *H01L 21/4835* (2013.01); *H01L 21/565* (2013.01); *C11D 2111/22* (2024.01)

(58) Field of Classification Search
CPC .......... C11D 1/00; C11D 3/43; C11D 3/0073; C11D 3/28; C11D 7/3281
USPC .................. 510/175, 176, 500, 505, 506
See application file for complete search history.

(56) References Cited

U.S. PATENT DOCUMENTS

| | | |
|---|---|---|
| 6,664,136 B2 | 12/2003 | Motonami et al. |
| 2005/0261151 A1 | 11/2005 | Lee et al. |

(Continued)

FOREIGN PATENT DOCUMENTS

| | | |
|---|---|---|
| CN | 106468860 A | 3/2017 |
| JP | H03-116842 A | 5/1991 |

(Continued)

OTHER PUBLICATIONS

Notice of Reasons of Refusal mailed May 28, 2024 in corresponding Japanese Patent Application No. 2021-151355, 8 pages (with translation).

(Continued)

*Primary Examiner* — Gregory R Delcotto
(74) *Attorney, Agent, or Firm* — Kim & Stewart LLP

(57) ABSTRACT

According to one embodiment, there is provided a cleaning agent. The cleaning agent includes an azole-based compound having a group including at least one selected from the group consisting of a glycidyl group, a hydrolyzable silyl group, and an amino group.

12 Claims, 3 Drawing Sheets

(56) References Cited

U.S. PATENT DOCUMENTS

| | | | |
|---|---|---|---|
| 2015/0111804 A1* | 4/2015 | Dory | C11D 3/0073 |
| | | | 510/175 |
| 2015/0136728 A1* | 5/2015 | Kim | C11D 7/265 |
| | | | 216/13 |
| 2018/0201884 A1* | 7/2018 | Sugishima | C11D 7/3281 |
| 2019/0016999 A1 | 1/2019 | Sakamuri et al. | |
| 2019/0062674 A1* | 2/2019 | Dory | H01L 21/02063 |
| 2022/0135915 A1* | 5/2022 | Her | C11D 3/43 |
| | | | 510/176 |

FOREIGN PATENT DOCUMENTS

| | | |
|---|---|---|
| JP | H1088104 A | 4/1998 |
| JP | H10-189857 A | 7/1998 |
| JP | H10-251777 A | 9/1998 |
| JP | 2003-197847 A | 7/2003 |
| JP | 2004-131836 A | 4/2004 |
| JP | 2005-041989 A | 2/2005 |
| JP | 2005-333104 A | 12/2005 |
| JP | 2012-160539 A | 8/2012 |
| JP | 2014-516478 A | 7/2014 |
| JP | 2018-526495 A | 9/2018 |
| WO | 2012/148967 A2 | 11/2012 |
| WO | WO-2017011617 A1 * | 1/2017 ......... C11D 11/0047 |
| WO | 2020137277 A1 | 7/2020 |

OTHER PUBLICATIONS

Notice of Reasons of Refusal mailed Oct. 29, 2024 in corresponding Japanese Patent Application No. 2021-151355, 8 pages (with translation).

* cited by examiner

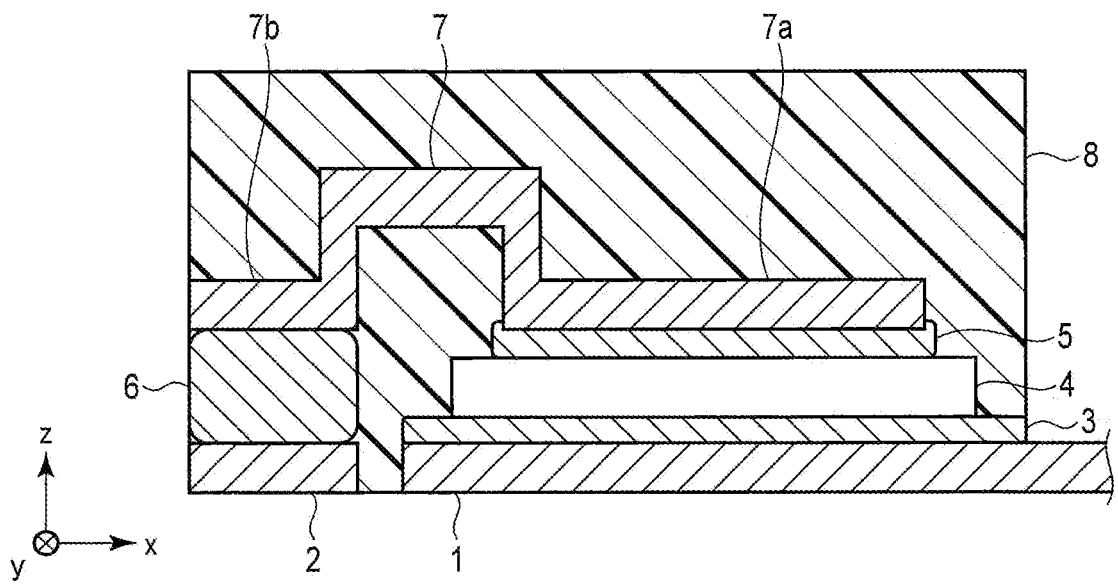
F I G. 1
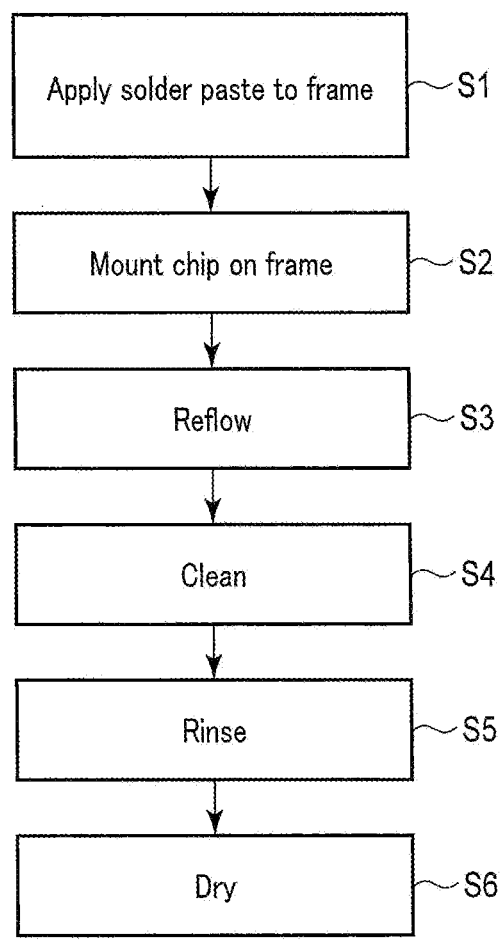
F I G. 2

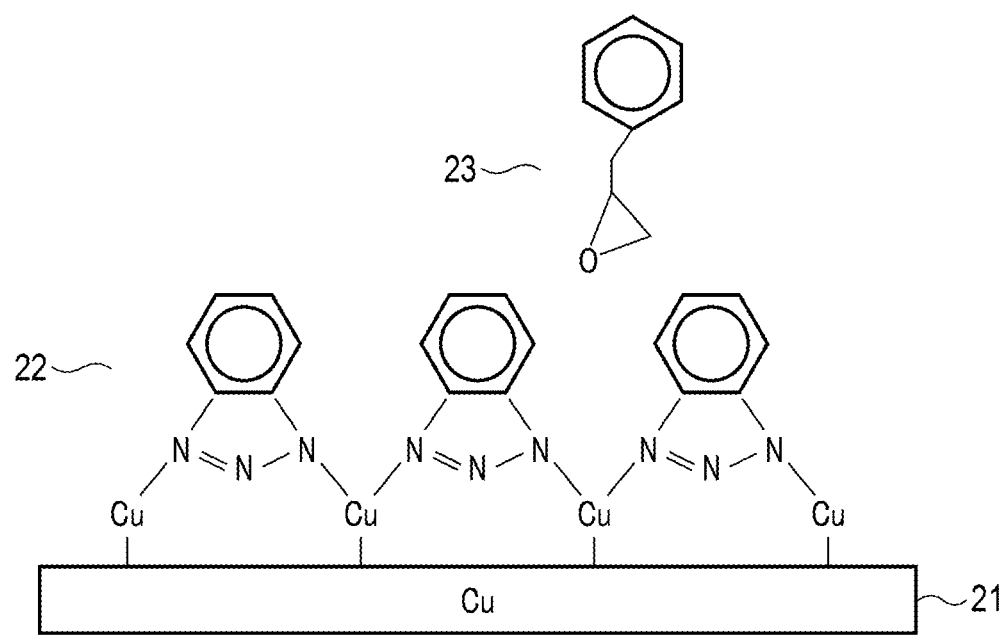
F I G. 6

CLEANING AGENT AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2021-151355, filed Sep. 16, 2021, the entire contents of which are incorporated herein by reference.

FIELD

Embodiments described herein relate generally to a cleaning agent and a method for manufacturing a semiconductor device.

BACKGROUND

In recent years, there is an increasing demand for high reliability of semiconductors. Semiconductor devices may fail due to peeling between a molded resin and a frame caused by a thermal stress, and may not satisfy the requirement for high reliability.

In particular, copper having good thermal conduction is mainly used as a frame material in a power semiconductor, but peeling progresses at a joining interface between copper and the molded resin due to oxidation, contamination, or chemical treatment in a treatment process. A thin film of copper oxide can provide good joinability to a resin, but, when the oxide film is thick, there is a problem that peeling is accelerated by internal destruction, and it is difficult to manage the oxide film.

BRIEF DESCRIPTION OF THE DRAWINGS

FIG. 1 is a cross-sectional view schematically illustrating an example of a semiconductor device manufactured by a method according to an embodiment;

FIG. 2 is a flowchart illustrating a flow example of some steps in the method according to the embodiment;

FIG. 6 is a schematic view illustrating a relationship between a rustproof agent on a conductor and a molded resin in a comparative example.

DETAILED DESCRIPTION

Figure 3:
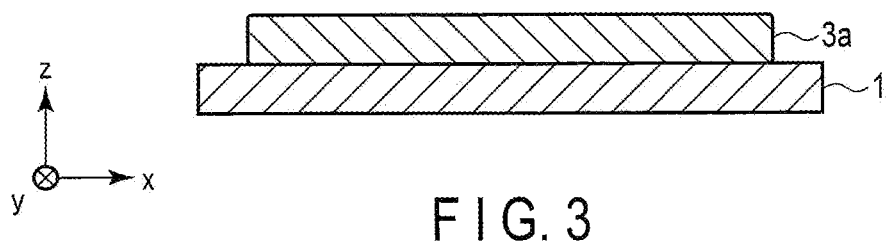
FIG. 3 is a cross-sectional view schematically illustrating one step in the method according to the embodiment.

In general, according to one embodiment, there is provided a cleaning agent. The cleaning agent includes an azole-based compound having a group including at least one selected from the group consisting of a glycidyl group, a hydrolyzable silyl group, and an amino group.

Hereinafter, an embodiment will be described with reference to the drawings. In the following description, components having substantially the same functions and configurations are denoted by the same reference numerals, and repeated description may be omitted. The drawings are schematic, and the relationship between the thickness and the plane dimensions, the ratio of the thickness of each layer, and the like may be different from actual ones. In addition, the drawings may include portions having different dimensional relationships and ratios. All statements about one embodiment also apply as statements about another embodiment unless expressly or explicitly excluded. Each embodiment exemplifies a device and a method for embodying the technical idea of this embodiment, and the technical idea of the embodiment does not specify the material, shapes, structures, arrangements, and the like of the components as follows.

First Embodiment

A first embodiment relates to a cleaning agent. The cleaning agent contains an azole-based compound (hereinafter referred to as azole-based rustproof agent) having a group including at least one selected from the group consisting of a glycidyl group, a hydrolyzable silyl group, and an amino group.

The cleaning agent of the embodiment can be used, for example, for removing impurities attached to an object. The object is not particularly limited as long as it includes a metal surface, and examples thereof can include a metal conductive member (metal conductor, metal material) to which an electronic component such as a semiconductor chip is soldered. Examples of the metal can include Cu and Cu alloys. Examples of the impurities include organic materials such as a flux used when an electronic component such as a semiconductor chip is soldered to a conductor. When the surface of the object is cleaned with the cleaning agent of the embodiment, the azole-based rustproof agent can be attached to the surface from which the impurities have been removed. The azole-based rustproof agent can suppress oxidation of the surface to suppress discoloration of the surface, and can improve adhesion between an object and a resin. Therefore, the cleaning agent of the embodiment can improve the adhesion of the object to the resin while suppressing discoloration of the object.

The azole-based compound constituting the azole-based rustproof agent may be a compound having an azole as a skeleton. The compound having an azole as a skeleton is, for example, at least one selected from the group consisting of benzotriazole, tolutriazole (TTA), 2-mercaptobenzothiazole (MBT), 2,5-dimercaptothiadiazole (DMTDA), benzimidazole (BIA), benzimidazole thiol (BIT), benzoxazole thiol (BOT), methylbenzothiazole, indole, and mercaptothiazoline. Each azole-based compound can adhere to a surface made of a metal such as Cu to suppress oxidation of the surface. An azole-based compound suitable for suppressing oxidation of Cu is benzotriazole.

The glycidyl group, the hydrolyzable silyl group, and the amino group may be functional groups added to the azole-based compound. Each functional group has good adhesion to a resin, for example, an epoxy resin. Only one functional group may be added to the azole-based compound, or two or more functional groups may be added to the azole-based compound.

The cleaning agent is desirably alkaline. When the cleaning agent of the embodiment is alkaline, the effect of cleaning the surface of the semiconductor chip can be enhanced.

Examples of chemical structural formulas of the azole-based rustproof agent are the following Chemical Formulas 1 to 5.

[Chemical Formula 1]

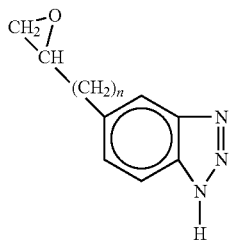

Chemical Formula 1 shows a structural formula of a compound in which a glycidyl group is added to benzotriazole. n is 0 or a natural number. When n is not 0, it may be in a range of 1 to 3.

[Chemical Formula 2]

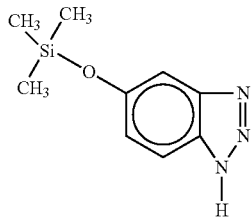

Chemical Formula 2 shows a structural formula of a compound in which a hydrolyzable silyl group is added to benzotriazole.

[Chemical Formula 3]

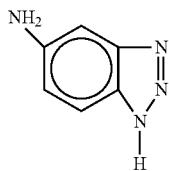

Chemical Formula 3 shows a structural formula of a compound in which an amino group is added to benzotriazole.

[Chemical Formula 4]

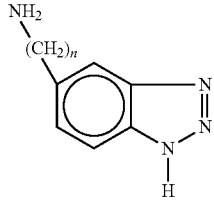

Chemical Formula 4 shows a structural formula of a compound in which an amino group is added to benzotriazole. n is 0 or a natural number. When n is not 0, it may be in a range of 1 to 3.

[Chemical Formula 5]

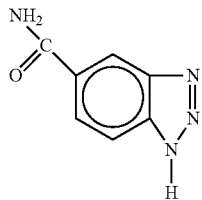

Chemical Formula 5 shows a structural formula of a compound in which an amino group is added to benzotriazole.

Only one azole-based rustproof agent may be contained in the cleaning agent. Alternatively, two or more azole-based rustproof agents having different functional groups or azole-based compounds may be contained in the cleaning agent. In addition, a rustproof agent other than the azole-based rustproof agent may be contained in the cleaning agent.

A content of the azole-based rustproof agent in the cleaning agent can be in a range of 1 wt % to 10 wt %. By setting the content to 1 wt % or more, the surface of the object can be covered with a sufficient amount of the azole-based rustproof agent. In addition, by setting the content to 10 wt % or less, it is possible to sufficiently remove impurities on the surface of the object without impairing the cleaning effect of the cleaning agent. A preferred range of the content is in a range of 1 wt % to 10 wt %.

The content of the azole-based rustproof agent in the cleaning agent can be measured by, for example, gas chromato graph mass spectrometer (GC-MASS).

The cleaning agent of the embodiment may contain a cleaning component in addition to the rustproof agent. Examples of the cleaning component can include an organic solvent. Examples of the organic solvent can include glycol ethers and alcohols. Examples of the glycol ethers can include diethylene glycol monobutyl ether. Examples of the alcohols can include aromatic alcohols, higher alcohols, and amino alcohols.

The cleaning agent may contain a component other than the rustproof agent and the cleaning component. Examples of other components can include nitrogen-containing compounds other than the azole-based compound, water, and metal salts.

The cleaning agent of the first embodiment described above contains an azole-based compound having a group including at least one selected from the group consisting of a glycidyl group, a hydrolyzable silyl group, and an amino group. As a result, impurities on the surface of the object can be removed, and oxidation and discoloration of the surface can be suppressed by protecting the surface. In addition, the adhesion of the object to the resin can be improved.

Second Embodiment

According to a second embodiment, a method for manufacturing a semiconductor device is provided. The method of the embodiment includes: solder-joining a semiconductor chip to a conductor (hereinafter referred to as a first step); cleaning the conductor and the semiconductor chip with the cleaning agent (hereinafter referred to as a second step); and sealing at least a part of the conductor and the semiconductor chip with a resin (hereinafter referred to as a third step). As the cleaning agent, for example, the cleaning agent of the embodiment can be used.

Figure 4:
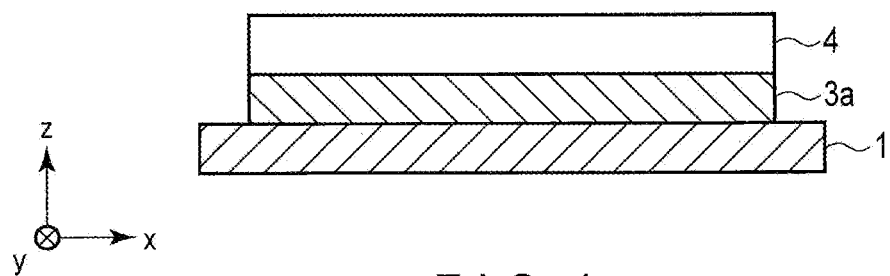
FIG. 4 is a cross-sectional view schematically illustrating one step in the method according to the embodiment.
Figure 5:
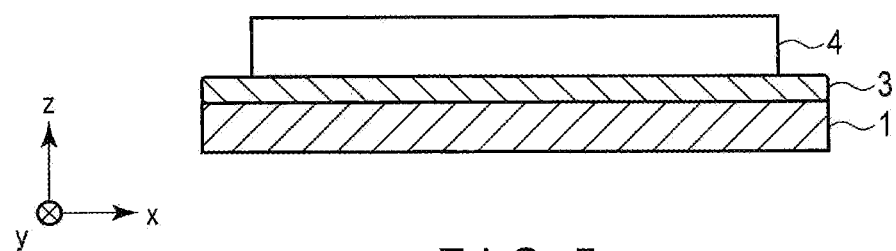
FIG. 5 is a cross-sectional view schematically illustrating one step in the method according to the embodiment.

Hereinafter, the method of the embodiment will be described, taking a semiconductor device having a structure illustrated in FIG. 1 as an example. A flowchart shown in FIG. 2 illustrates examples of the first step and the second step. FIGS. 3 to 5 are cross-sectional views schematically illustrating an example of the first step.

The semiconductor device illustrated in FIG. 1 includes a first conductor 1, a second conductor 2, a first solder layer 3, a semiconductor chip 4, a second solder layer 5, a third solder layer 6, a third conductor 7, and a molded resin 8. The first conductor 1 and the second conductor 2 are lead frames. A first main surface along an xy plane of the semiconductor chip 4 is joined to a first surface along an xy plane of the first conductor 1 by the first solder layer 3. The third conductor 7 is, for example, a clip portion. The third conductor 7 is a connector including a first joint portion 7a and a second joint portion 7b. The first joint portion 7a is joined to a second main surface along the xy plane of the semiconductor chip 4 via the second solder layer 5. The second joint portion 7b is joined to a first surface of the second conductor 2 via the third solder layer 6. The third conductor 7 can promote heat dissipation from the semiconductor chip 4 and reduce resistance. The molded resin 8 covers the surfaces of the first, second, and third conductors 1, 2, and 7 excluding lead portions (not illustrated) and the surface of the semiconductor chip 4, and also is filled into gaps between the members. As a result, the semiconductor chip and the portions of the first, second, and third conductors excluding at least the lead portions are sealed with the resin. Each of the first, second, and third conductors 1, 2, and 7 may be formed of, for example, Cu or a Cu alloy. FIG. 1 illustrates an example in which the first conductor 1 and the second conductor 2 have a lead portion, but the third conductor 7 may have a lead portion.

First Step

In the first step, steps S1 to S3 illustrated in FIG. 2 are first performed.

In step S1, as illustrated in FIG. 3, a solder paste 3a is applied to the first surface along xy of the first conductor 1. The solder paste 3a contains components such as a solder alloy and a flux. The flux is made of, for example, an organic material.

In step S2, as illustrated in FIG. 4, the semiconductor chip 4 is disposed on the solder paste 3a of the first conductor 1. The first main surface along an xy plane of the semiconductor chip 4 is in contact with the solder paste 3a.

Simultaneously with steps S1 and S2 or after steps S1 and S2, a solder paste is applied to the first surface along xy of the second conductor 2. Next, the second joint portion 7b of the third conductor 7 is disposed on the solder paste of the second conductor 2. A series of these steps is referred to as step A.

After step A or simultaneously with step A, the solder paste is applied to the second main surface along the xy plane of the semiconductor chip 4, and then the first joint portion 7a of the third conductor 7 is disposed on the solder paste.

Next, in step S3, as a part thereof is exemplified in FIG. 5, the first solder layer 3 is formed between the semiconductor chip 4 and the first conductor 1 by reflow, the second solder layer 5 is formed between the first joint portion 7a of the third conductor 7 and the semiconductor chip 4, and the third solder layer 6 is formed between the second joint portion 7b of the third conductor 7 and the second conductor 2. In this manner, the first, second, and third conductors 1, 2, and 7 are soldered to the semiconductor chip 4.

Second Step

In the second step, steps S4 to S6 are performed.

In step S4, the semiconductor chip (hereinafter, referred to as an unsealed semiconductor device) joined to the first, second, and third conductors using the first, second, and third solder layers is cleaned with the cleaning agent of the first embodiment. By step S4, impurities such as a flux remaining on the surfaces of the first, second, and third conductors can be removed.

Examples of the cleaning method include directly immersing an object in a cleaning agent (for example, cleaning liquid), spraying the cleaning agent (for example, cleaning liquid) to the object, and brushing the object using the cleaning agent (for example, cleaning liquid).

Next, in step S5, a rinsing treatment of rinsing the unsealed semiconductor device with water is performed. Thus, the cleaning agent and the like remaining on the first, second, and third conductors, the semiconductor chip, and the like can be removed.

Next, in step S6, the unsealed semiconductor device is dried.

Thus, the second step can remove impurities remaining on the first, second, and third conductors, the semiconductor chip, and the like. Although the removal of impurities increases the activities of the surfaces of the first, second, and third conductors, the azole-based rustproof agent contained in the cleaning agent is attached to the surfaces of the first, second, and third conductors, and thus oxidation and discoloration of the surfaces of the first, second, and third conductors can be suppressed.

Third Step

The third step is performed by, for example, resin molding. Examples of the resin used in molding include an epoxy resin and a phenol resin. The type of the resin used may be one or two or more. In addition, a filler such as silica ($SiO_2$) particles may be added to the resin. Examples of the composition (resin material to be molded) used in molding include compositions containing an epoxy resin, a phenol resin, and silica particles.

Examples of the molding method include various methods such as a transfer molding method and a compression molding method. There is also a molding method using a potting gel. Transfer molding is a method in which a resin is softened by heating in a plunger, and the softened resin is poured into a die and cured. Since the softened resin is used, it is easy to fill the resin even into gaps of a semiconductor device having a complicated shape.

By the third step, the semiconductor chip and the portions of the first, second, and third conductors excluding at least the lead portions are sealed with the resin. The azole-based rustproof agent on the surfaces of the first, second, and third conductors is excellent in adhesion to the resin. The mechanism by which good adhesion can be obtained is not clear, but is presumed as follows. It is presumed that the glycidyl group, the hydrolyzable silyl group, and the amino group contained in the azole-based rustproof agent form a hydrogen bond or the like with a resin, for example, an epoxy resin, thereby increasing the adhesion between the azole-based rustproof agent and the resin.

The method of the second embodiment described above includes: solder-joining a semiconductor chip to a conductor; cleaning the conductor and the semiconductor chip with the cleaning agent of the embodiment; and sealing at least a part of the conductor and the semiconductor chip with a resin. According to this method, impurities remaining when the conductor and the semiconductor chip are soldered can be removed with the cleaning agent. The cleaning with the cleaning agent increases the activity of the surface of the conductor, but the azole-based rustproof agent is attached to the surface of the conductor. As a result, oxidation and discoloration of the surface of the conductor can be suppressed. In addition, since the azole-based rustproof agent is excellent in adhesion to the resin, it is possible to prevent the resin from being peeled from the semiconductor device.

EXAMPLES

Hereinafter, Examples and Comparative Examples will be described.

Example 1-1

The semiconductor device illustrated in FIG. 1 was manufactured by the method described in the second embodiment. The presence or absence of discoloration of the conductors of the obtained semiconductor device and the presence or absence of peeling between the conductors and the molded resin were confirmed.

A Cu lead frame portion was used for the first conductor 1 and the second conductor 2 of the semiconductor device. A Cu clip portion was used for the third conductor 7.

The composition (resin material) used in resin sealing contained 10 to 30 wt % of an epoxy resin, 10 to 20 wt % of a phenol resin, and 60 to 80 wt % of silica.

As the resin sealing method, a transfer molding method or the like was used.

As the cleaning agent, an alkaline cleaning liquid containing 80 mass % of benzyl alcohol, 10 mass % of water, 3 mass % of an azole-based rustproof agent represented by the structural formula (n is 0) shown in Chemical Formula 1, and the balance including glycol ether and polyoxyalkylene aryl ether was used.

The presence or absence of discoloration of the conductors was determined by visually checking the presence or absence of discoloration of copper of the first and second conductors 1 and 2 and the third conductor 7. The results are shown in Table 1.

A peeling test was performed by performing Moisture Sensitivity level (MSL) Level 3 and then observing the presence or absence of peeling by SAT (Scanning Acoustic Tomography). The number of targets was 96. The presence or absence of peeling was observed at two places of resin peeling from a bed portion of the first conductor 1 and resin peeling from the third conductor 7. These results are shown in Table 1.

Conditions for the MSL Level 3 are as follows.
(1) Baking: 125° C./20 h
(2) Moisture absorption: 30° C./60%/216 h
(3) Reflow: peak temperature 260° C.
(4) Number of times of reflow: 3 times Example 1-2

A semiconductor device was manufactured in the same manner as in Example 1-1 except that the azole-based rustproof agent was changed to a compound of the structural formula (n is 1) shown in Chemical Formula 1. The presence or absence of discoloration of the conductors of the obtained semiconductor device and the presence or absence of peeling between the conductors and the molded resin were confirmed by the same method as in Example 1-1, and the results thereof are shown in Table 1.

Example 2

A semiconductor device was manufactured in the same manner as in Example 1-1 except that the azole-based rustproof agent was changed to a compound of the structural formula shown in Chemical Formula 2. The presence or absence of discoloration of the conductors of the obtained semiconductor device and the presence or absence of peeling between the conductors and the molded resin were confirmed by the same method as in Example 1-1, and the results thereof are shown in Table 1.

Example 3

A semiconductor device was manufactured in the same manner as in Example 1-1 except that the azole-based rustproof agent was changed to a compound of the structural formula shown in Chemical Formula 3. The presence or absence of discoloration of the conductors of the obtained semiconductor device and the presence or absence of peeling between the conductors and the molded resin were confirmed by the same method as in Example 1-1, and the results thereof are shown in Table 1.

Example 4

A semiconductor device was manufactured in the same manner as in Example 1-1 except that the azole-based rustproof agent was changed to a compound of the structural formula (n is 1) shown in Chemical Formula 4. The presence or absence of discoloration of the conductors of the obtained semiconductor device and the presence or absence of peeling between the conductors and the molded resin were confirmed by the same method as in Example 1-1, and the results thereof are shown in Table 1.

Example 5

A semiconductor device was manufactured in the same manner as in Example 1-1 except that the azole-based rustproof agent was changed to a compound of the structural formula shown in Chemical Formula 5. The presence or absence of discoloration of the conductors of the obtained semiconductor device and the presence or absence of peeling between the conductors and the molded resin were confirmed by the same method as in Example 1-1, and the results thereof are shown in Table 1.

Comparative Example

A semiconductor device was manufactured in the same manner as in Example 1-1 except that benzotriazole was used as the rustproof agent instead of the azole-based rustproof agent. The presence or absence of discoloration of the conductors of the obtained semiconductor device and the presence or absence of peeling between the conductors and the molded resin were confirmed by the same method as in Example 1-1, and the results thereof are shown in Table 1.

TABLE 1

| | Azole-based rustproof agent | Peeling test bed surface | Peeling test clip surface | Discoloration |
|---|---|---|---|---|
| Example 1-1 | Chemical Formula 1 | 0/96 | 0/96 | None |
| Example 1-2 | Chemical Formula 1 | 0/96 | 0/96 | None |
| Example 2 | Chemical Formula 2 | 0/96 | 0/96 | None |
| Example 3 | Chemical Formula 3 | 0/96 | 0/96 | None |
| Example 4 | Chemical Formula 4 | 0/96 | 0/96 | None |
| Example 5 | Chemical Formula 5 | 0/96 | 0/96 | None |
| Comparative Example | Benzotriazole | 8/96 | 2/96 | None |

As is apparent from Table 1, according to the cleaning agents of Examples 1 to 5, the first and second conductors 1 and 2 (lead frame portions) and the third conductor 7 (clip portion) in the semiconductor device manufactured using each cleaning agent were not discolored. In addition, neither peeling of the resin from the bed portion of the first conductor 1 nor peeling of the resin from the third conductor 7 occurred.

On the other hand, in the semiconductor device manufactured using the cleaning agent of the comparative example, discoloration did not occur in the lead frame portions or the clip portion. However, both the peeling of the resin from the bed portion and the peeling of the resin from the clip portion occurred. The cause for this will be described with reference to FIG. 6. A rustproof agent 22 made of benzotriazole is in close contact with a surface of a Cu conductor 21, and can protect the surface to suppress oxidation, but is not in close contact with an epoxy resin of a molded resin 23. Therefore, the resin is presumed to have been peeled from both the bed portion and the clip portion.

Example 6-1

A semiconductor device was manufactured in the same manner as in Example 1-1 except that, in place of benzotriazole, tolutriazole, 2-mercaptobenzothiazole, 2,5-dimercaptothiadiazole, benzimidazole, benzimidazole thiol, benzoxazole thiol, methylbenzothiazole, indole, and mercaptothiazoline were each used as the azole-based compound of the azole-based rustproof agent of Example 1-1. For the obtained nine semiconductor devices, the presence or absence of discoloration of the conductors and the presence or absence of peeling between the conductors and the molded resin were confirmed in the same manner as in Example 1-1. As a result, neither the first and second conductors 1 and 2 (lead frame portions) nor the third conductor 7 (clip portion) was discolored. In addition, neither peeling of the resin from the bed portion of the first conductor 1 nor peeling of the resin from the third conductor 7 occurred.

Example 6-2

A semiconductor device was manufactured in the same manner as in Example 1-1 except that, the azole-based rustproof agent was changed to the azole-based rustproof agent of Example 1-2, and as the azole-based compound of the azole-based rustproof agent of Example 1-2, in place of benzotriazole, tolutriazole, 2-mercaptobenzothiazole, 2,5-dimercaptothiadiazole, benzimidazole, benzimidazole thiol, benzoxazole thiol, methylbenzothiazole, indole, and mercaptothiazoline were each used. For the obtained nine semiconductor devices, the presence or absence of discoloration of the conductors and the presence or absence of peeling between the conductors and the molded resin were confirmed in the same manner as in Example 1-1. As a result, neither the first and second conductors 1 and 2 (lead frame portions) nor the third conductor 7 (clip portion) was discolored. In addition, neither peeling of the resin from the bed portion of the first conductor 1 nor peeling of the resin from the third conductor 7 occurred.

Example 7

A semiconductor device was manufactured in the same manner as in Example 1-1 except that, the azole-based rustproof agent was changed to the azole-based rustproof agent of Example 2, and as the azole-based compound of the azole-based rustproof agent of Example 2, in place of benzotriazole, tolutriazole, 2-mercaptobenzothiazole, 2,5-dimercaptothiadiazole, benzimidazole, benzimidazole thiol, benzoxazole thiol, methylbenzothiazole, indole, and mercaptothiazoline were each used. For the obtained nine semiconductor devices, the presence or absence of discoloration of the conductors and the presence or absence of peeling between the conductors and the molded resin were confirmed in the same manner as in Example 1-1. As a result, neither the first and second conductors 1 and 2 (lead frame portions) nor the third conductor 7 (clip portion) was discolored. In addition, neither peeling of the resin from the bed portion of the first conductor 1 nor peeling of the resin from the third conductor 7 occurred.

Example 8

A semiconductor device was manufactured in the same manner as in Example 1-1 except that, the azole-based rustproof agent was changed to the azole-based rustproof agent of Example 3, and as the azole-based compound of the azole-based rustproof agent of Example 3, in place of benzotriazole, tolutriazole, 2-mercaptobenzothiazole, 2,5-dimercaptothiadiazole, benzimidazole, benzimidazole thiol, benzoxazole thiol, methylbenzothiazole, indole, and mercaptothiazoline were each used. For the obtained nine semiconductor devices, the presence or absence of discoloration of the conductors and the presence or absence of peeling between the conductors and the molded resin were confirmed in the same manner as in Example 1-1. As a result, neither the first and second conductors 1 and 2 (lead frame portions) nor the third conductor 7 (clip portion) was discolored. In addition, neither peeling of the resin from the bed portion of the first conductor 1 nor peeling of the resin from the third conductor 7 occurred.

Example 9

A semiconductor device was manufactured in the same manner as in Example 1-1 except that, the azole-based rustproof agent was changed to the azole-based rustproof agent of Example 4, and as the azole-based compound of the azole-based rustproof agent of Example 4, in place of benzotriazole, tolutriazole, 2-mercaptobenzothiazole, 2,5-dimercaptothiadiazole, benzimidazole, benzimidazole thiol, benzoxazole thiol, methylbenzothiazole, indole, and mercaptothiazoline were each used. For the obtained nine semiconductor devices, the presence or absence of discoloration of the conductors and the presence or absence of peeling between the conductors and the molded resin were confirmed in the same manner as in Example 1-1. As a result, neither the first and second conductors 1 and 2 (lead frame portions) nor the third conductor 7 (clip portion) was discolored. In addition, neither peeling of the resin from the bed portion of the first conductor 1 nor peeling of the resin from the third conductor 7 occurred.

Example 10

A semiconductor device was manufactured in the same manner as in Example 1-1 except that, the azole-based rustproof agent was changed to the azole-based rustproof agent of Example 5, and as the azole-based compound of the azole-based rustproof agent of Example 5, in place of benzotriazole, tolutriazole, 2-mercaptobenzothiazole, 2,5-dimercaptothiadiazole, benzimidazole, benzimidazole thiol, benzoxazole thiol, methylbenzothiazole, indole, and mercaptothiazoline were each used. For the obtained nine semiconductor devices, the presence or absence of discoloration of the conductors and the presence or absence of peeling between the conductors and the molded resin were confirmed in the same manner as in Example 1-1. As a result, neither the first and second conductors 1 and 2 (lead frame portions) nor the third conductor 7 (clip portion) was discolored. In addition, neither peeling of the resin from the bed portion of the first conductor 1 nor peeling of the resin from the third conductor 7 occurred.

The cleaning agent of at least one embodiment or example described above contains an azole-based compound having a group including at least one selected from the group consisting of a glycidyl group, a hydrolyzable silyl group, and an amino group, and thus discoloration of the surface of the object can be suppressed, and adhesion between the object and the resin can be improved.

Hereinafter, the inventions of the embodiments will be additionally described.

The embodiment provides a cleaning agent containing an azole-based compound having a group including at least one selected from the group consisting of a glycidyl group, a hydrolyzable silyl group, and an amino group.

Also, the embodiment provides a method for manufacturing a semiconductor device, the method including:
solder-joining a semiconductor chip to a conductor;
cleaning the conductor and the semiconductor chip with the cleaning agent according to the embodiment; and
sealing at least a part of the conductor and the semiconductor chip with a resin.

In addition, the embodiment provides a cleaning method including cleaning, with the cleaning agent of the embodiments, a conductor containing Cu or a Cu alloy to which an electronic component is soldered.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A cleaning agent comprising from 1 wt % to 10 wt % of an azole-based compound comprising a glycidyl group, wherein the glycidyl group is directly attached to the azole-based compound.

2. The cleaning agent according to claim 1, wherein the azole-based compound is at least one selected from the group consisting of benzotriazole, tolutriazole, 2-mercaptobenzothiazole, 2,5-dimercaptothiadiazole, benzimidazole, benzimidazole thiol, benzoxazole thiol, methylbenzothiazole, indole, and mercaptothiazoline.

3. The cleaning agent according to claim 1, wherein the azole-based compound comprising the glycidyl group is represented by Chemical Formula 1

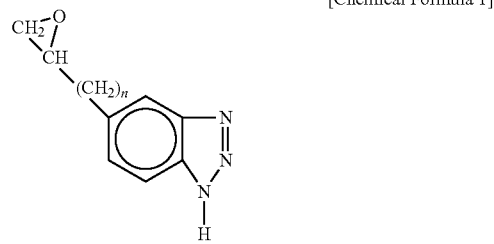

[Chemical Formula 1]

wherein n is 0 or a natural number.

4. The cleaning agent according to claim 1, further comprising a cleaning component.

5. The cleaning agent according to claim 4, wherein the cleaning component comprises an organic solvent.

6. The cleaning agent according to claim 1, which is alkaline.

7. A method for manufacturing a semiconductor device, the method comprising:
solder-joining a semiconductor chip to a conductor;
cleaning the conductor and the semiconductor chip with the cleaning agent according to claim 1; and
sealing at least a part of the conductor and the semiconductor chip with a resin.

8. The method for manufacturing a semiconductor device according to claim 7, wherein the resin comprises an epoxy resin.

9. The method for manufacturing a semiconductor device according to claim 7, wherein the conductor comprises Cu.

10. The method for manufacturing a semiconductor device according to claim 7, wherein the solder-joining is performed by reflow.

11. The method for manufacturing a semiconductor device according to claim 7, wherein the sealing is performed by resin molding.

12. The method for manufacturing a semiconductor device according to claim 11, wherein the resin molding is performed a method selected from the group consisting of a transfer molding method and a compression molding method.

* * * * *